United States Patent
Takatsuka et al.

(10) Patent No.: US 10,482,472 B2
(45) Date of Patent: Nov. 19, 2019

(54) INFORMATION PROCESSING DEVICE, CONTROL METHOD FOR SAME, CONTROL PROGRAM, AND RECORDING MEDIUM

(71) Applicant: OMRON Corporation, Kyoto (JP)

(72) Inventors: Hiromasa Takatsuka, Kyoto (JP); Kazuki Kasai, Kyoto (JP); Taiji Yoshikawa, Kyoto (JP)

(73) Assignee: Omron Corporation, Kyoto (JP)

( * ) Notice: Subject to any disclaimer, the term of this patent is extended or adjusted under 35 U.S.C. 154(b) by 210 days.

(21) Appl. No.: 15/554,969

(22) PCT Filed: Jan. 13, 2016

(86) PCT No.: PCT/JP2016/050825
§ 371 (c)(1),
(2) Date: Aug. 31, 2017

(87) PCT Pub. No.: WO2016/143373
PCT Pub. Date: Sep. 15, 2016

(65) Prior Publication Data
US 2018/0047031 A1 Feb. 15, 2018

(30) Foreign Application Priority Data
Mar. 12, 2015 (JP) ................ 2015-049612

(51) Int. Cl.
*G06Q 30/00* (2012.01)
*G01R 31/36* (2019.01)
(Continued)

(52) U.S. Cl.
CPC ......... *G06Q 30/018* (2013.01); *G01R 31/367* (2019.01); *G01R 31/392* (2019.01); *G06Q 30/0645* (2013.01)

(58) Field of Classification Search
CPC .. G01R 31/367; G01R 31/392; G06Q 10/063; G06Q 10/30; G06Q 30/018; G06Q 30/0645; G06Q 50/06; Y02W 90/20
(Continued)

(56) References Cited

U.S. PATENT DOCUMENTS 10,046,664 B2\* 8/2018 Komiyama ......... B60L 11/1861
2003/0209375 A1 11/2003 Suzuki et al.
(Continued)

FOREIGN PATENT DOCUMENTS

JP 2001-057711 A 2/2001
JP 2001-306961 A 11/2001
(Continued)

OTHER PUBLICATIONS

Search Report issued in European Application No. 16761345.4, dated Jan. 8, 2018 (7 pages).
(Continued)

*Primary Examiner* — John H Le
(74) *Attorney, Agent, or Firm* — Osha Liang LLP (57) ABSTRACT

An extraction component extracts one or more batteries such that the sum total of the full charge capacity falls within an exclusion target range. An index calculator calculates an index value indicating the usage status of the batteries included among the one or more extracted batteries. An exclusion candidate determination component determines which batteries to exclude from those to be loaned out, on the basis of the ranking of the index value.

20 Claims, 5 Drawing Sheets

(51) Int. Cl.
  *G01R 31/367* (2019.01)
  *G01R 31/392* (2019.01)
  *G06Q 30/06* (2012.01)

(58) Field of Classification Search
  USPC .................. 702/60, 63; 320/136; 180/65.22; 705/307
  See application file for complete search history.

(56) References Cited

U.S. PATENT DOCUMENTS

| | | |
|---|---|---|
| 2009/0027056 A1 | 1/2009 | Huang et al. |
| 2013/0066791 A1 | 3/2013 | Sakamoto et al. |
| 2013/0085696 A1 | 4/2013 | Xu et al. |

FOREIGN PATENT DOCUMENTS

| | | |
|---|---|---|
| JP | 2012-006591 A | 1/2012 |
| JP | 2013-090360 A | 5/2013 |

OTHER PUBLICATIONS

International Search Report issued in PCT/JP2016/050825 dated Mar. 15, 2016 (1 page).

\* cited by examiner

FIG. 1

| BATTERY ID | RATED POWER | SOH | CAPACITY | CUMULATIVE NUMBER OF USES | CUMULATIVE TRAVEL DISTANCE | CUMULATIVE OPERATING TIME | ... |
|---|---|---|---|---|---|---|---|
| 1 | 1kWh | 73% | 0.73kWh | 388 TIMES | 9890km | 450 DAYS | ... |
| 2 | 2kWh | 65% | 1.3kWh | 480 TIMES | 10202km | 503 DAYS | ... |
| 3 | 2kWh | 95% | 1.9kWh | 53 TIMES | 1519km | 55 DAYS | ... |
| ... | ... | ... | ... | ... | ... | ... | ... |

FIG. 2

| BATTERY ID | | LATEST | LAST TIME | TWO TIMES AGO | THREE TIMES AGO | ... |
|---|---|---|---|---|---|---|
| 1 | LOAN DATE AND TIME | 11/02 20:34 | 11/01 09:03 | 10/28 18:39 | 10/15 10:00 | ... |
| | RETURN DATE AND TIME | 11/03 12:40 | 11/01 18:32 | 10/30 18:40 | 10/16 09:19 | ... |
| 2 | LOAN DATE AND TIME | 10/25 14:55 | 10/15 11:00 | 10/8 08:30 | 10/5 15:34 | ... |
| | RETURN DATE AND TIME | 10/27 08:50 | 10/15 18:02 | 10/10 15:24 | 10/7 07:43 | ... |
| 3 | LOAN DATE AND TIME | 11/03 10:28 | 11/02 10:01 | 11/01 09:17 | 10/31 10:23 | ... |
| | RETURN DATE AND TIME | 11/03 12:30 | 11/02 18:31 | 11/02 00:20 | 10/31 19:17 | ... |
| ... | ... | ... | ... | ... | ... | ... |

FIG. 3

| COMBINATION | BATTERY ID | TOTAL CAPACITY | INDEX EXPRESSING USAGE STATE | | | |
|---|---|---|---|---|---|---|
| | | | AVERAGE SOH | MINIMUM SOH | SUM TOTAL OF CUMULATIVE OPERATING TIMES | SUM TOTAL OF CUMULATIVE TRAVEL DISTANCES |
| A | 1, 2, 4 | 9.85kWh | 80.7% | 65% | 1056 HOURS | 25107km |
| B | 1, 2, 8, 9 | 9.57kWh | 81.0% | 65% | 1289 HOURS | 29076km |
| C | 3, 6, 8 | 9.48kWh | 70.8% | 65.2% | 1254 HOURS | 28629km |
| ... | ... | ... | ... | ... | ... | ... |

INFORMATION PROCESSING DEVICE, CONTROL METHOD FOR SAME, CONTROL PROGRAM, AND RECORDING MEDIUM

CROSS-REFERENCE TO RELATED APPLICATIONS

This application claims the benefit of Japanese Application No. JP2015-049612, filed Mar. 12, 2015 and International Application PCT/JP2016/050825, filed Jan. 13, 2016, both of which are incorporated herein by reference in their entirety.

TECHNICAL FIELD

The present invention generally relates to an information processing device, to a method for controlling the device, to a control program, and to a recording medium, and relates, for example, to an information processing device that manages a plurality of batteries to be loaned out in a battery swap system.

BACKGROUND

Conventionally, batteries (so-called secondary cells) have been used as a power supply source in electric vehicles. The battery needs to be charged with the required power by the time of use. In view of this, Patent Literature 1 discusses a charging control device that adjusts the battery charging speed and charge amount according to information such as the remaining capacity of the battery, the destination of the next trip, and the scheduled departure time on the next trip. The invention discussed in Patent Literature 1 assumes a case in which a single battery is used for one user.

Recent years have seen the advent of a system for loaning out a plurality of batteries to users of electric cars. This system is called a battery swap system because it exchanges (swaps) a returned battery with a charged battery when the used battery is returned from the user of the system (see Patent Literature 2, for example).

CITATION LIST

Patent Literature

Patent Literature 1: Japanese Laid-Open Patent Application 2013-90360 (disclosed on May 13, 2013)

Patent Literature 2: Japanese Laid-Open Patent Application 2012-6591 (disclosed on Jan. 12, 2012)

SUMMARY

The power supply amount provided by the battery swap system may correspond to the power demand amount from the user of the battery swap system. Therefore, if the power supply amount is too much higher than the power demand, some of the batteries to be loaned out are excluded (discarded or removed) from the battery swap system in order to reduce power supply amount.

Not all of the batteries in a battery swap system are in the same usage state. For example, a battery having a higher degree of deterioration (a poor usage state) is considered to have a higher likelihood of failure compared with a battery having a lower degree of deterioration (a good usage state). Accordingly, in a battery swap system it may be that for batteries in a worse usage state to be preferentially excluded from the group being loaned out.

However, conventionally there have been no criteria for determining which batteries should be preferentially excluded from the group being loaned out. Therefore, for example, the batteries in a battery swap system are sometimes excluded from the group being loaned out, even though they should not yet be excluded (because there are other batteries with a worse usage state).

One or more embodiments of the present invention provide an information processing device with which the batteries to be excluded from the group being loaned out can be determined according to the usage state of the batteries when the power supply amount of one or more batteries loaned out by a battery swap system is too high.

In one or more embodiments, the information processing device pertaining to the present invention is an information processing device for determining which batteries are to be excluded from among those to be loaned out in a system for loaning out a plurality of batteries, the information processing device comprising an extraction component, an index calculator, and a selector. The extraction component extracts one or more of the batteries such that a sum total of a full charge capacity or a battery count falls within an exclusion target range. The index calculator calculates an index that indicates a usage status of one or more of the batteries extracted by the extraction component. The selector selects one or more batteries to exclude from those that will be loaned out, from among the batteries extracted by the extraction component, on the basis of an index ranking calculated by the index calculator.

The control method pertaining to one or more embodiments of the present invention is a method for controlling an information processing device for determining which of a plurality of batteries are to be excluded from among those to be loaned out in a system for loaning out a plurality of batteries, the control method comprising an extraction step, an index calculation step, and a selection step. The extraction step involves extracting, from among a plurality of batteries, one or more of the batteries in which a sum total of a full charge capacity or a battery count falls within an exclusion target range. The index calculation step involves calculating an index that indicates a usage state of the one or more batteries extracted in the extraction step. The selection step involves selecting which batteries to exclude from those to be loaned out, from among the one or more batteries extracted in the extraction step, on the basis of a ranking of the index calculated in the index calculation step.

With the above configuration, one or more batteries to be "excluded" from those to be loaned out are selected on the basis of an index that indicates the usage state of the batteries. The sum total of the full charge capacity of the one or more batteries to be "excluded" from those to be loaned out is included in an exclusion target range.

In one or more embodiments the present invention, "exclusion" from those to be loaned out includes discarding the batteries, as well as moving the batteries from a first system to a second system, or moving them from a first station where the batteries are charged to a second station.

Therefore, if one or more of the selected batteries are "excluded" from those to be loaned out, the sum total of the full charge capacity of the batteries that are loaned out by the system is reduced. Also, a battery that is "excluded" is selected on the basis of the ranking of the index. That is, batteries to be "excluded" from those to be loaned out can be determined according to the usage state of the battery.

For example, when the batteries to be "excluded" from those to be loaned out are selected starting with those with the highest (or lowest) index, after those batteries have been "excluded" from those to be loaned out, only batteries with a lower (or higher) index are left in the system. The exclusion target range may be preset, or may be input by the user.

Also, with the information processing device pertaining to one or more embodiments of the present invention, if just one battery is extracted by the extraction component, then the selector may select that battery as the one to be excluded from those to be loaned out.

With the above configuration, if there is just one battery, or a combination of a plurality of batteries, that battery or combination of batteries can be selected as the one or ones to be "excluded" from those to be loaned out.

Also, with the information processing device pertaining to one or more embodiments of the present invention, if no batteries have been extracted by the extraction component, the selector may determine that no batteries are to be excluded from those to be loaned out.

With the above configuration, since batteries for which the sum total of the full charge capacity is not included in the exclusion target range are not "excluded" from those to be loaned out, the power supply amount will be neither too high nor too low.

Also, with the information processing device pertaining to one or more embodiments of the present invention, there is further provided a presentation component that presents the one or more batteries selected by the selector as batteries that should be excluded.

With the above configuration, the user can check this presentation to confirm the batteries that should be "excluded" from those to be loaned out, and thereby "exclude" those batteries.

Also, with the information processing device pertaining to one or more embodiments of the present invention, the exclusion target range is at or below the surplus power supply amount of the batteries with respect to the power demand.

With the above configuration, if one or more batteries in which the sum total of the full charge capacity or the battery count falls within the exclusion target range have been "excluded" from those to be loaned out, the surplus in battery candidate or power supply amount with respect to the power demand is reduced.

Also, with the information processing device pertaining to one or more embodiments of the present invention, the usage state may be the degree of deterioration of the battery, the cumulative operating time of the battery, or the cumulative travel distance of the vehicle in which the battery is installed.

With the above configuration, the batteries to be "excluded" from those to be loaned out are determined according to the ranking of the index expressing the degree of deterioration of the batteries. This index expressing the degree of deterioration may be the SOH (state of health) indicating the degree of deterioration of a battery, the cumulative operating time, or the "cumulative travel distance." The "cumulative travel distance" of a battery refers to the distance traveled by the vehicle in which that battery is installed.

One or more embodiments of the present invention advantageously allow that in a system for loaning out a plurality of batteries, when the power supply amount of a plurality of batteries is excessive, the batteries to be excluded from those to be loaned out can be determined according to the usage state of the batteries.

DETAILED DESCRIPTION

One or more embodiments of the present invention will now be described in detail.
Configuration of Battery Management Device 1

Figure 1:
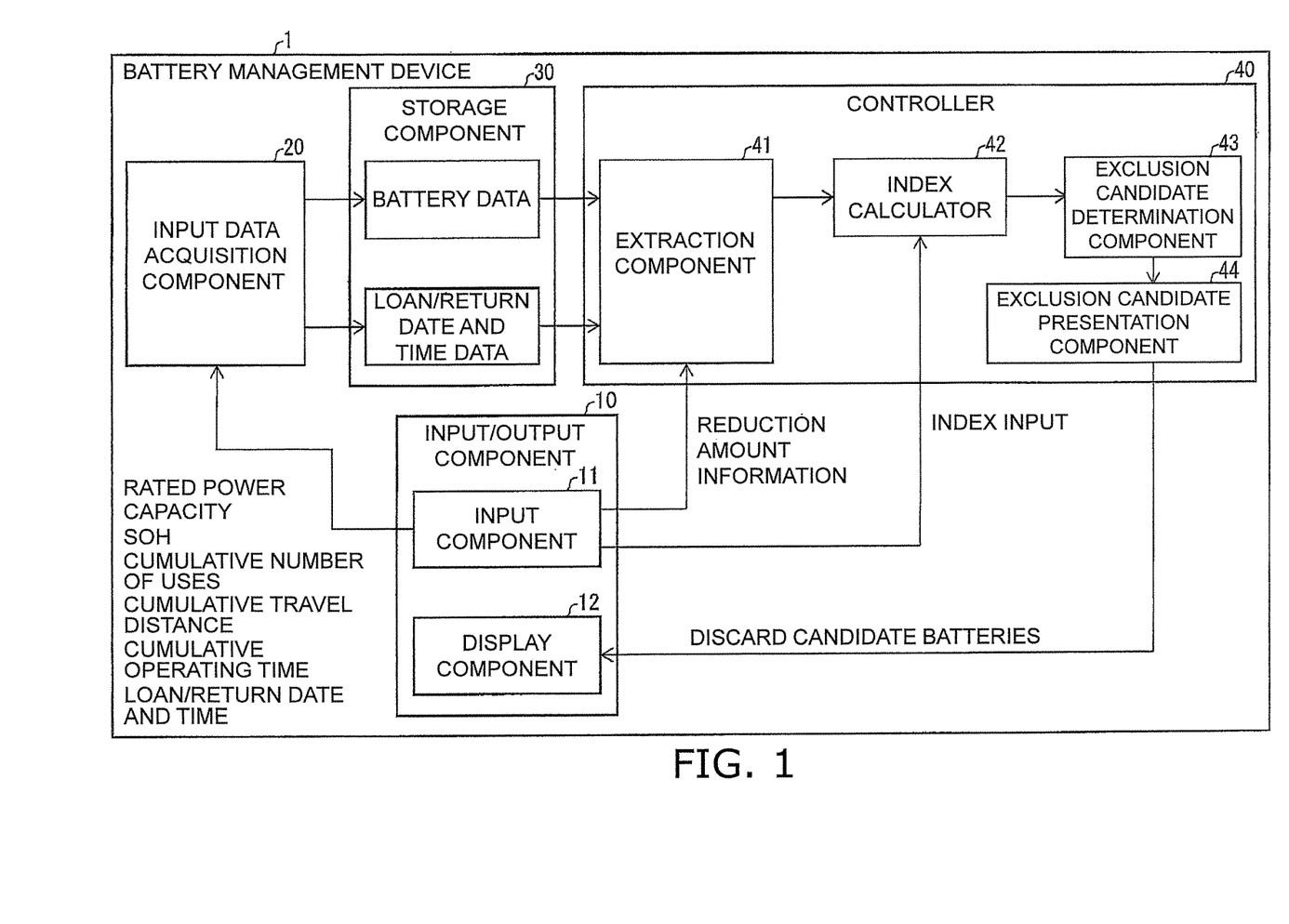
FIG. 1 is a block diagram of the configuration of a battery management device pertaining to one or more embodiments.

The configuration of a battery management device 1 pertaining to one or more embodiments will be described through reference to FIG. 1. FIG. 1 is a block diagram of the configuration of the battery management device 1. As shown in FIG. 1, the battery management device 1 comprises an input/output component 10, an input data acquisition component 20, a storage component 30, and a controller 40 (information processing device).

The battery management device 1 is a device that manages the power supply amount of a plurality of batteries loaned out by a battery swap system (hereinafter abbreviated as "system"). If the surplus of the power supply amount with respect to the power demand is not within a suitable range (that is, if there is an excess), the battery management device 1 presents information about the batteries that should be "excluded" from those to be loaned out by the system (exclusion candidate batteries). Upon checking the presented information, the user (of the battery management device 1) can reduce the excess power supply amount by "excluding" the exclusion candidate batteries from those to be loaned out.

The "exclusion" of one or more embodiments of the present invention encompasses discarding a battery, as well as moving a battery from a first system to a second system, or moving it from a first station where the batteries are charged to a second station.
Input/Output Component 10

As shown in FIG. 1, the input/output component 10 includes an input component 11 and a display component 12. The input component 11 is an input device such as a keyboard, a mouse, a touch panel, or the like. The user can use the input component 11 to input information indicating the usage state of a battery, or to input parameters used in exclusion candidate battery decision processing (discussed below). The display component 12 is a display device such as an EL (electroluminescence) display, an LED (light emitting diode) display, a liquid crystal display (LCD), or the like.
Input Data Acquisition Component 20, Storage Component 30

The input data acquisition component 20 acquires data for index values expressing the usage state of a plurality of batteries, from the input component 11 of the input/output component 10. It also acquires loan/return date and time data indicating date and time when batteries are loaned out and returned.

The input data acquisition component 20 stores the battery data including index data in the storage component 30. Also, the loan/return date and time data indicating the date and time when the batteries are loaned out and returned is stored in the storage component 30.

Examples of Indexes

The index indicating the usage state of the battery may be one of the following (i) to (iv), the result of processing these, or a combination thereof.

(i) the average SOH for one or more batteries (average SOH value)

(ii) the minimum SOH for one or more batteries of (minimum SOH value)

(iii) the sum total of the cumulative operating time for one or more batteries (iv) the sum total of the "cumulative travel distance" for one or more batteries Alternatively, the index may be the cumulative operating time, the cumulative number of uses, the cumulative capacity usage, or the usage starting date and time for one or more batteries.

The indexes (i) to (iv) are related to the degree of deterioration of a battery. However, the index need not be related to the degree of deterioration of the battery as long as it expresses the usage state of the battery.

For instance, examples of an index that is not directly related to the degree of deterioration of the battery include the number of times the battery was used over a specific period of time in the past, the interval between times when the battery was loaned out (or returned), and combinations thereof.

Battery Data, Loan/Return Date and Time Data

Figure 2:
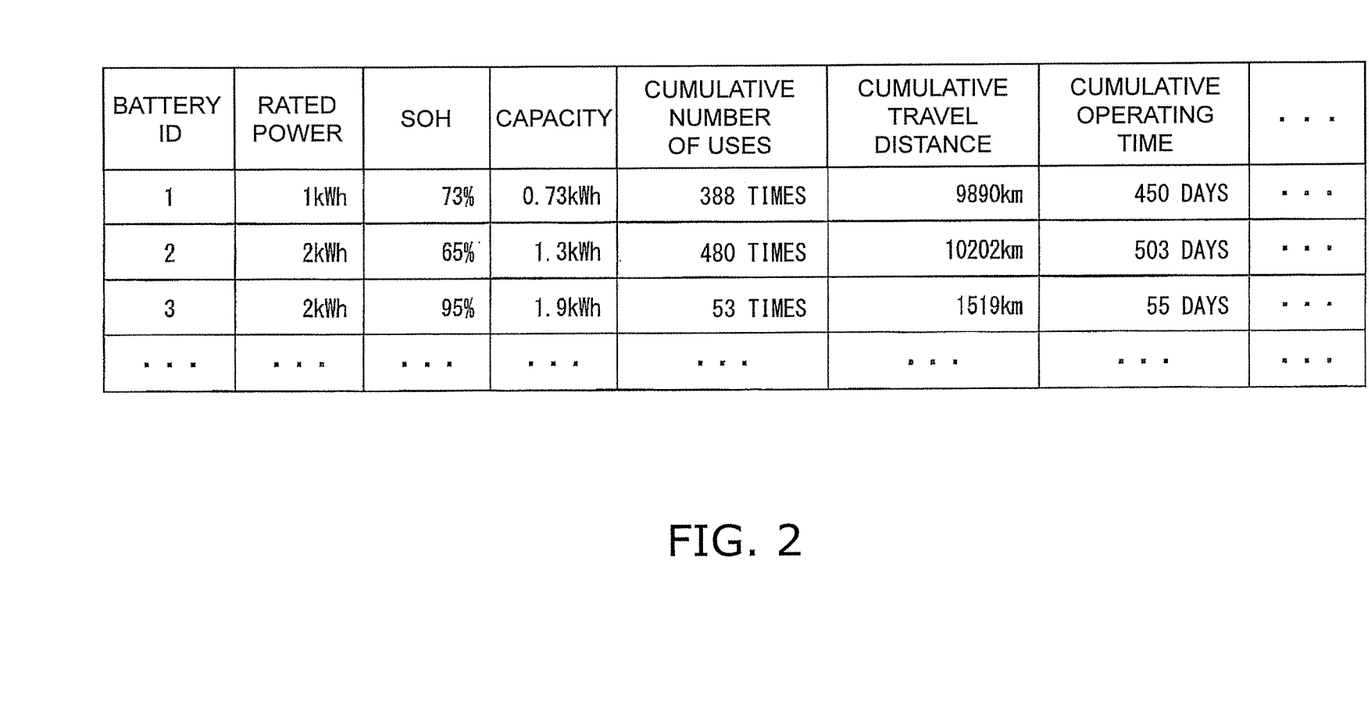
FIG. 2 is an example of battery data stored in a storage component provided to the battery management device pertaining to one or more embodiments.

FIG. 2 shows an example of battery data stored in the storage component 30. The battery data shown in FIG. 2 includes, as index data, data indicating battery IDs, the rated power, the SOH, the full charge capacity, the cumulative number of uses, the "cumulative travel distance," and the cumulative operating time. Examples of other indexes will be given below.

Figure 3:
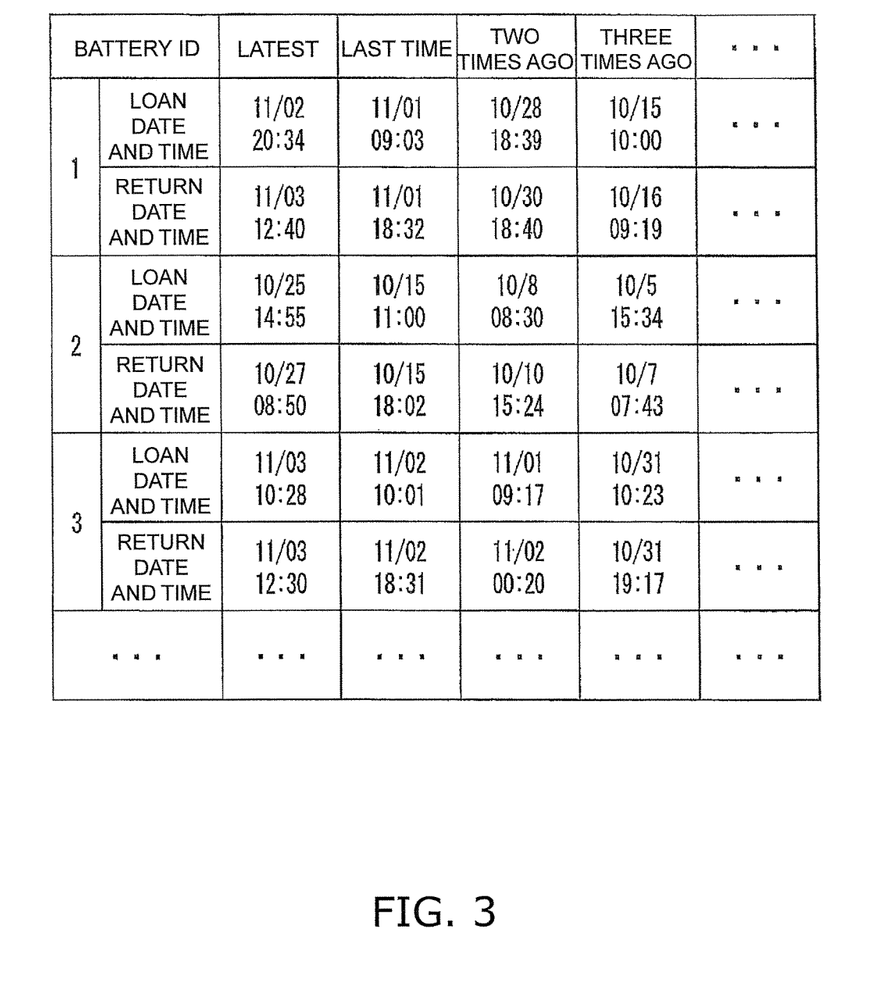
FIG. 3 is an example of loan/return date and time data stored in the storage component provided to the battery management device pertaining to one or more embodiments.

FIG. 3 shows an example of loan/return date and time data stored in the storage component 30. The loan/return date and time data shown in FIG. 3 includes data indicating battery IDs, loan dates and times, and return dates and times.

Controller 40

As shown in FIG. 1, the controller 40 includes an extraction component 41, an index calculator 42, an exclusion candidate determination component 43, and an exclusion candidate presentation component 44. The various components of the controller 40 execute exclusion candidate battery decision processing to determine which batteries should be "excluded" from those to be loaned out in this system (exclusion candidate batteries) when the power supply amount of the system is excessive. The flow of this exclusion candidate battery decision processing will be described below.

Extraction component 41

The extraction component 41 extracts one or more batteries on the basis of an exclusion target amount of the power supply amount. More specifically, the extraction component 41 produces one or more sets of batteries so that the sum total of the full charge capacity of one or more batteries will be at or under the exclusion target amount and at or over a lower limit amount (or will be included in an exclusion target range).

Here, the exclusion target amount may be an amount obtained by subtracting a predetermined threshold from the excess amount of the power supply amount with respect to the power demand. In this case, when the power supply amount is reduced by the exclusion target amount, the excess amount of the power supply amount becomes a specific threshold. This specific threshold may be preset, or may be inputted via the input component 11. Also, the lower limit amount may be a fixed proportion (such as 80% or 90%) of the exclusion target amount.

The extraction component 41 outputs the extracted battery information to the index calculator 42.

Index Calculator 42

The index calculator 42 calculates an index value for every set of batteries extracted by the extraction component 41. More specifically, the index calculator 42 calculates the index value for each set by adding up the index values of the batteries included in that set.

Examples of Combinations and Indexes

Figure 4:
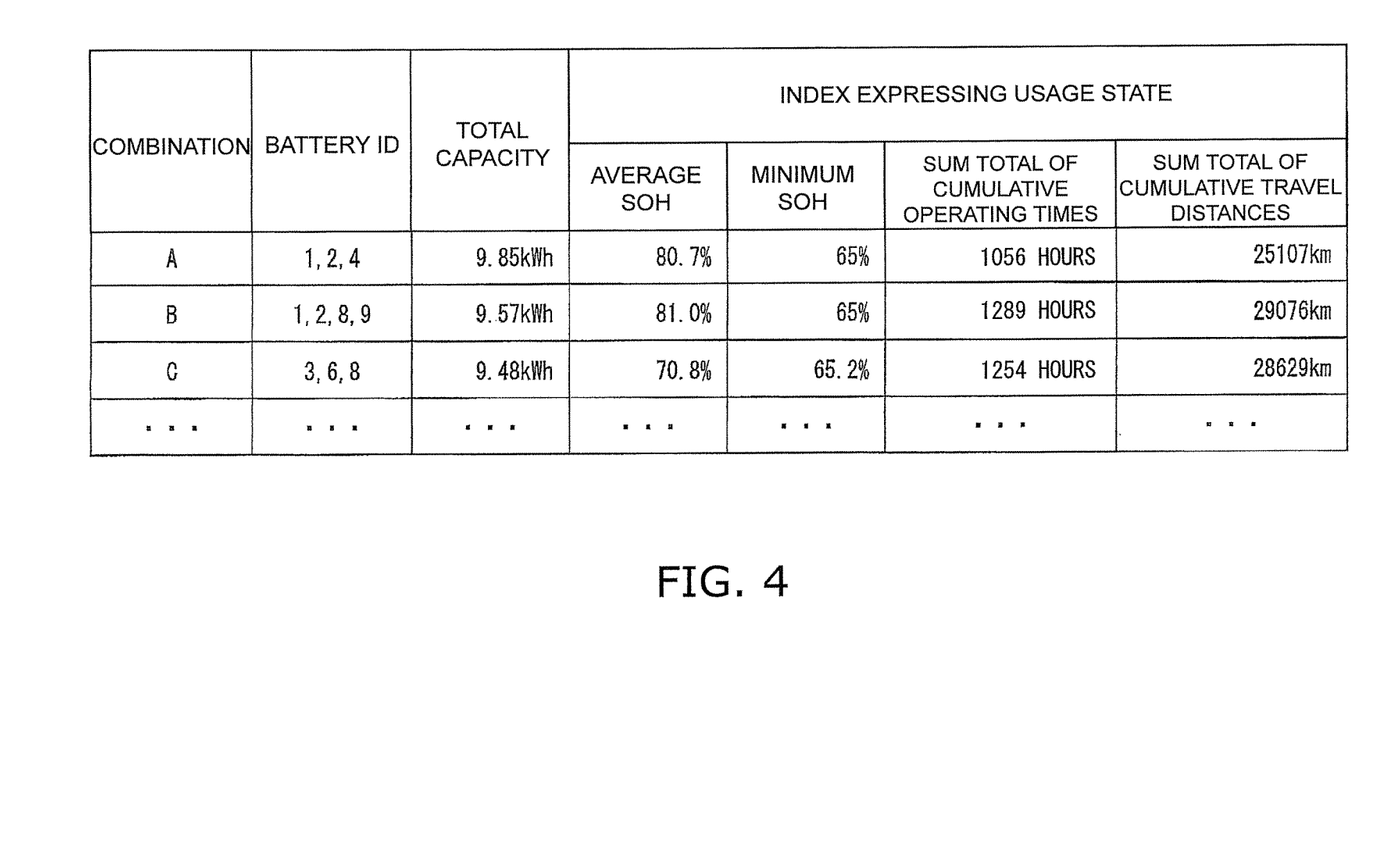
FIG. 4 shows an example of a combination of batteries extracted by an extraction component provided to the battery management device pertaining to one or more embodiments.

FIG. 4 shows a combination of a plurality of batteries extracted by the extraction component 41 (when the exclusion target amount is 10 kWh), and the index values for (various indexes of) combinations of the batteries calculated by the index calculator 42.

As shown in FIG. 4, the combination A is made up of three batteries (battery IDs 1, 2, and 4). The sum total of the full charge capacity of the batteries included in combination A is 9.85 kWh.

Also, the sum totals of the full charge capacity of the batteries included in combination B and combination C are 9.57 kWh and 9.48 kWh, respectively.

The sum totals of the full charge capacities of the batteries included in the combinations A to C are all less than or equal to the exclusion target amount of 10 kWh. The sum totals of the full charge capacities of the batteries included in the combinations may all be equal to or greater than the lower limit amount (such as 8 kWh).

As shown in FIG. 4, when the index is the average SOH, the index value of combination A is 80.7%. The index values of combination B and combination C are 81.0% and 70.8%, respectively.

On the other hand, if the index is the minimum SOH, the index value of combination A is 65%. The index values of combination B and combination C are 65% and 65.2%, respectively.

The index calculator 42 outputs the calculated index value to the exclusion candidate determination component 43.

Exclusion candidate determination component 43 and Exclusion Candidate Presentation Component 44

The exclusion candidate determination component 43 determines or selects a combination of exclusion candidates (exclusion candidate batteries) from among the combinations extracted by the extraction component 41, on the basis of the index values calculated by the index calculator 42. More specifically, the exclusion candidate determination component 43 determines or selects batteries included in a combination having the highest ranking of the index values (that is, the index value is the largest or smallest) as exclusion candidate batteries. Whether the ranking of the combination with the highest index value is the highest, or whether the ranking of the combination with the smallest index value is the highest, is determined for each index.

For example, when the index is the average SOH, it is assumed that the ranking of the combination having the smallest index value is the highest. When the index is the average SOH, combination A, combination B, and combination C shown in FIG. 4 have higher index values in that order. Therefore, the exclusion candidate determination component 43 selects combination C as the exclusion candidate batteries from among the combinations shown in FIG. 4.

The exclusion candidate determination component 43 outputs to the exclusion candidate presentation component 44 information related to the determined or selected exclusion candidate batteries (battery combination). More specifically, the exclusion candidate determination component 43 outputs to the exclusion candidate presentation component 44 information for specifying the exclusion candidate batteries, such as the exclusion candidate battery IDs.

The exclusion candidate presentation component 44 causes the display component 12 to display information related to the exclusion candidate batteries inputted from the exclusion candidate determination component 43.

Exclusion candidate battery decision processing

Figure 5:
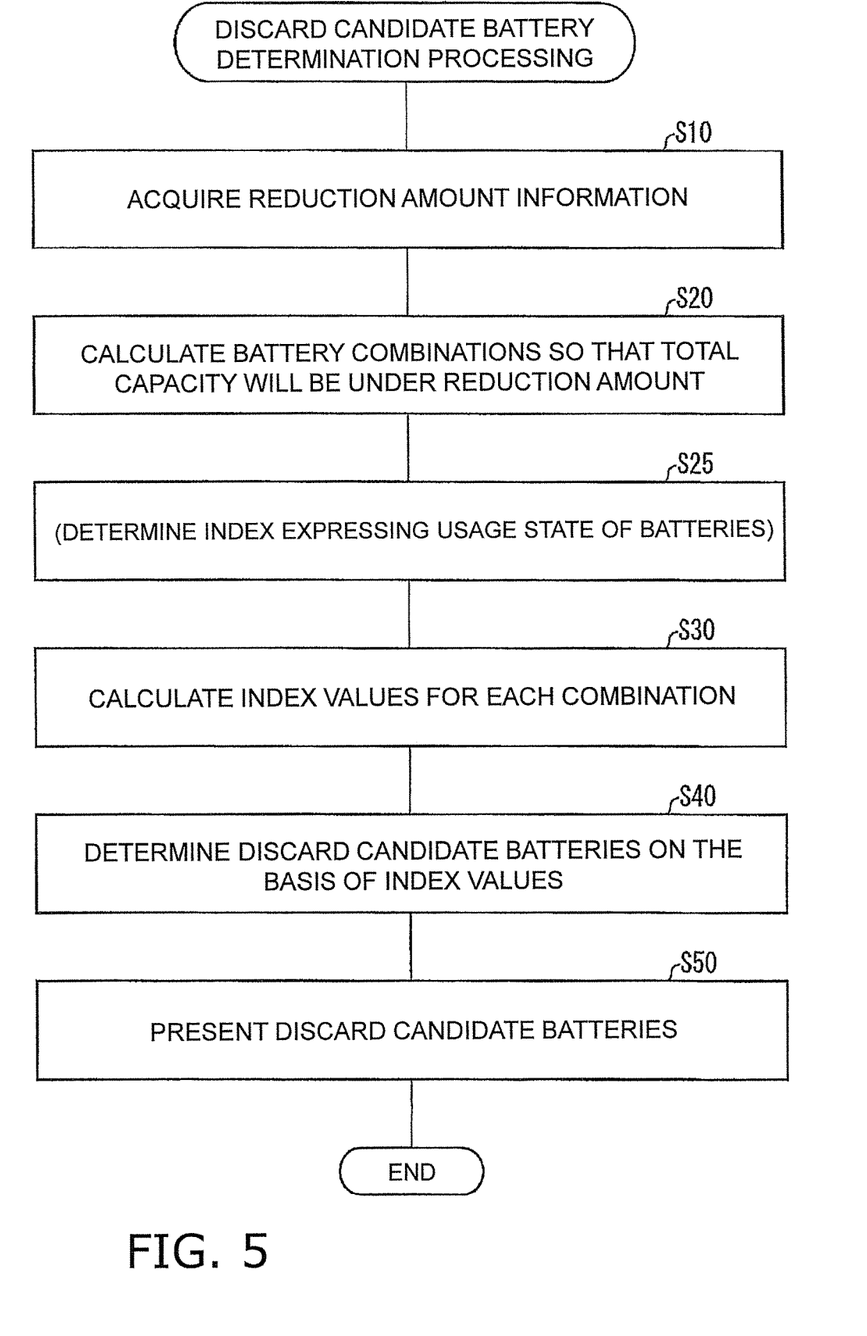
FIG. 5 is a flowchart of the flow of exclusion candidate battery decision processing executed by a controller provided to the battery management device pertaining to one or more embodiments.

The flow of the exclusion candidate battery decision processing executed by the controller 40 (see FIG. 1) will now be described through reference to FIG. 5. FIG. 5 is a flowchart of the flow of the exclusion candidate battery decision processing.

As shown in FIG. 5, in the exclusion candidate battery decision processing, first the extraction component 41 acquires exclusion target amount information indicating the exclusion target amount of the power supply amount from the input component 11 (S10). The extraction component 41 calculates combinations of one or more batteries so that the sum total of the full charge capacity of the batteries that make up the combinations will be under the exclusion target amount (or not exceed the exclusion target amount) (S20, extraction step).

Next, the index calculator 42 determines an index representing the usage state of the battery (S25). Here, when the index is preset, S25 is not performed in the exclusion candidate battery decision processing, and after the processing of S20, the processing of S30 is next performed.

The index calculator 42 then calculates an index value for each combination of batteries (S30, index calculation step).

After this, the exclusion candidate determination component 43 determines on exclusion candidate batteries on the basis of the calculated index value (S40, exclusion candidate selection step).

Finally, the exclusion candidate presentation component 44 presents information related to the exclusion candidate batteries (S50). More specifically, the exclusion candidate presentation component 44 causes the display component 12 to display information for specifying the exclusion candidate batteries, such as the IDs (or an ID list) of the exclusion candidate batteries. This completes the exclusion candidate battery decision processing. One or more other embodiments (A)

In the one or more above embodiments, as shown in FIG. 4, an example was given of selecting which combinations to exclude from those to be loaned out, from among a plurality of battery combinations, but the present invention is not limited to this.

For example, batteries to be excluded from those to be loaned out are not limited to a combination of a plurality of batteries, and just one battery may be excluded. Alternatively, groups consisting of one battery and a plurality of batteries may be combined and excluded from those to be loaned out.

(B)

In the one or more above embodiments, the power consuming unit in which the battery loaned out from this system is installed is not specifically illustrated.

Examples of applications of the batteries loaned out from this system include electric cars (EVs), electric motorcycles, electric unicycles, electric bicycles, motor-assisted bicycles, and PHVs (plug-in hybrid vehicles).

Also, the power consuming unit in which the battery is installed is not limited to a vehicle, and may also be other electrical products that are driven by exchangeable batteries.

Examples of these electrical products include refrigerators, washing machines, vacuum cleaners, rice cookers, electric kettles, and other such household appliances that run on electricity supplied by a battery pack.

Furthermore, the power consuming unit in which the battery is installed may be a power tool.

In this case, the battery used in the power tool may be charged at a battery station or the like where a plurality of batteries that can be loaned out are charged.

Example of Implementation by Software

The controller 40 of the battery management device 1 (particularly the extraction component 41, the index calculator 42, and the exclusion candidate determination component 43) may be realized by a logic circuit (hardware) formed on an integrated circuit (IC chip) or the like, or it may be realized by software using a CPU (central processing unit).

In the latter case, the battery management device 1 comprises a CPU that executes the commands of a program, which is software for carrying out various functions, a ROM (read only memory) or a storage device (these are referred to as "recording media") in which the above-mentioned program and various kinds of data are recorded so as to be readable by a computer (or CPU), a RAM (random access memory) for developing the program, etc. The computer (or CPU) then reads the program from the recording medium and executes the program. The recording medium can be a "non-transitory tangible medium," such as a tape, disk, card, semiconductor memory, or programmable logic circuit. Also, the above-mentioned program may be supplied to the computer via any transmission medium capable of transmitting the program (a communication network, a broadcast wave, etc.). One or more embodiments of the present invention can also be realized in the form of a data signal embedded in a carrier wave, in which the program is embodied by electronic transmission. Although the disclosure has been described with respect to only a limited number of embodiments, those skilled in the art, having benefit of this disclosure, will appreciate that various other embodiments may be devised without departing from the scope of the present invention. Accordingly, the scope of the invention should be limited only by the attached claims.

INDUSTRIAL APPLICABILITY

One or more embodiments of the present invention can be utilized in devices that manage a plurality of batteries loaned out in a battery swap system.

REFERENCE SIGNS LIST 40 controller (information processing device)
41 extraction component
42 index calculator
43 exclusion candidate determination component (selector)
44 exclusion candidate presentation component (presentation component)

The invention claimed is:

1. An information processing device for determining which batteries are to be excluded from among those to be loaned out in a system for loaning out a plurality of batteries, the information processing device comprising:
   an extraction component extracting one or more of the batteries such that a sum total of a full charge capacity or a battery count falls within an exclusion target range;
   an index calculator calculating an index that indicates a usage status of one or more of the batteries extracted by the extraction component; and
   a selector selecting one or more batteries to exclude from those that will be loaned out, from among the batteries extracted by the extraction component, on the basis of an index ranking calculated by the index calculator.

2. The information processing device according to claim 1,
   wherein the exclusion target range is at or below a surplus power supply amount of the plurality of battery with respect to a power demand in the system.

3. The information processing device according to claim 2,
   wherein the usage state is a degree of deterioration of the battery.

4. The information processing device according to claim 2,
   wherein the usage state is a cumulative operating time of the battery.

5. The information processing device according to claim 2,
   wherein the usage state is a cumulative travel distance of a vehicle in which the battery is installed.

6. The information processing device according to claim 2,
   wherein, if the one or more batteries extracted by the extraction component is one set,
   then the selector selects that one set as the batteries to be excluded from those to be loaned out.

7. The information processing device according to claim 2,
   wherein, if no batteries have been extracted by the extraction component, the selector determines that no batteries are to be excluded from those to be loaned out.

8. The information processing device according to claim 1,
   wherein the usage state is a degree of deterioration of the battery.

9. The information processing device according to claim 8,
   wherein, if the one or more batteries extracted by the extraction component is one set,
   then the selector selects that one set as the batteries to be excluded from those to be loaned out.

10. The information processing device according to claim 8,
    wherein, if no batteries have been extracted by the extraction component, the selector determines that no batteries are to be excluded from those to be loaned out.

11. The information processing device according to claim 1,
    wherein the usage state is a cumulative operating time of the battery.

12. The information processing device according to claim 11,
    wherein, if the one or more batteries extracted by the extraction component is one set,
    then the selector selects that one set as the batteries to be excluded from those to be loaned out.

13. The information processing device according to claim 1,
    wherein the usage state is a cumulative travel distance of a vehicle in which the battery is installed.

14. The information processing device according to claim 13,
    wherein, if the one or more batteries extracted by the extraction component is one set,
    then the selector selects that one set as the batteries to be excluded from those to be loaned out.

15. The information processing device according to claim 1,
    wherein, if the one or more batteries extracted by the extraction component is one set,
    then the selector selects that one set as the batteries to be excluded from those to be loaned out.

16. The information processing device according to claim 1,
    wherein, if no batteries have been extracted by the extraction component, the selector determines that no batteries are to be excluded from those to be loaned out.

17. The information processing device according to claim 1,
    further comprising a presentation component configured to present the one or more batteries selected by the selector as batteries to be excluded from those to be loaned out.

18. A control program for causing a computer to function as the information processing device according to claim 1, wherein the control program causes the computer to function as the extraction component, the index calculator, and the selector.

19. A non-transitory computer-readable recording medium on which the control program according to claim 18 is recorded.

20. A method for controlling an information processing device for determining which of a plurality of batteries are to be excluded from among those to be loaned out in a system for loaning out a plurality of batteries, the method comprising:
    extracting, from among the plurality of batteries, one or more of the batteries in which a sum total of a full charge capacity or a battery count falls within an exclusion target range;
    calculating an index that indicates a usage state of the one or more batteries extracted in the extracting step; and
    selecting which batteries to exclude from those to be loaned out, from among the one or more batteries extracted in the extraction step, on the basis of a ranking of the index calculated in the index calculation step.

* * * * *